United States Patent
Huang et al.

(10) Patent No.: US 8,519,419 B2
(45) Date of Patent: Aug. 27, 2013

(54) SEMICONDUCTOR LIGHT-EMITTING STRUCTURE HAVING LOW THERMAL STRESS

(75) Inventors: Shih-Cheng Huang, Hsinchu (TW); Po-Min Tu, Hsinchu (TW); Shun-Kuei Yang, Hsinchu (TW); Chia-Hung Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 259 days.

(21) Appl. No.: 13/171,472

(22) Filed: Jun. 29, 2011

(65) Prior Publication Data
US 2012/0086032 A1    Apr. 12, 2012

(30) Foreign Application Priority Data
Oct. 11, 2010   (CN) .......................... 2010 1 0502906

(51) Int. Cl.
*H01L 33/00* (2010.01)
(52) U.S. Cl.
USPC ............... 257/98; 257/E33.068; 257/E33.072

(58) Field of Classification Search
USPC ............................ 257/98, E33.068, E33.072
See application file for complete search history.

(56) References Cited

U.S. PATENT DOCUMENTS
6,803,603 B1 * 10/2004 Nitta et al. ..................... 257/79
2009/0098675 A1   4/2009 Masui et al.
2010/0098127 A1   4/2010 Higuchi et al.

FOREIGN PATENT DOCUMENTS
JP    2009-99668 A    5/2009
JP    2010-123921 A   6/2010
TW    M334549 U       6/2008

* cited by examiner

*Primary Examiner* — Minh-Loan T Tran
(74) *Attorney, Agent, or Firm* — Altis Law Group, Inc.

(57) ABSTRACT

A semiconductor light-emitting structure includes a silicon substrate, a distributed Bragg reflector, a semiconductor structures layer and an epitaxy connecting layer. The silicon substrate has a top surface. The distributed Bragg reflector is formed on the top surface of the silicon substrate. The semiconductor structures layer is configured for emitting light. The epitaxy connecting layer is placed between the distributed Bragg reflector and the semiconductor structures layer. Grooves extend from the semiconductor structures layer through the epitaxy connecting layer and the distributed Bragg reflector to reach the semiconductor structures layer.

14 Claims, 4 Drawing Sheets

SEMICONDUCTOR LIGHT-EMITTING STRUCTURE HAVING LOW THERMAL STRESS

BACKGROUND

1. Technical Field

The present disclosure relates to a semiconductor structure, and more particularly, to a semiconductor light-emitting structure having low thermal stress.

2. Description of Related Art

As new type light source, LEDs are widely used in various applications. An LED includes an LED chip to emit light. A conventional LED chip includes a substrate, and an N-type semiconductor layer, a light-emitting layer and a P-type semiconductor layer sequentially grown on the substrate. The substrate is generally made of sapphire ($Al_2O_3$) for providing growing environment to the layers. However, such a sapphire substrate has a low heat conductivity, causing that heat generated by the layers cannot be timely dissipated. Therefore, a new type substrate made of Si is developed. Such a Si substrate has a heat conductivity larger than that of the sapphire substrate so that the heat generated by the layers can be effectively removed.

Nevertheless, the coefficient of thermal expansion (CTE) of the Si substrate does not well match with that of the layers. Thus, during operation of the LED chip, the Si substrate has a deformation different from that of the layers, resulting in a thermal stress concentrated at an interface between the substrate and the layers. Such concentrated thermal stress may cause fracture of the layers or even damage of the LED chip.

What is needed, therefore, is a semiconductor light-emitting structure which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
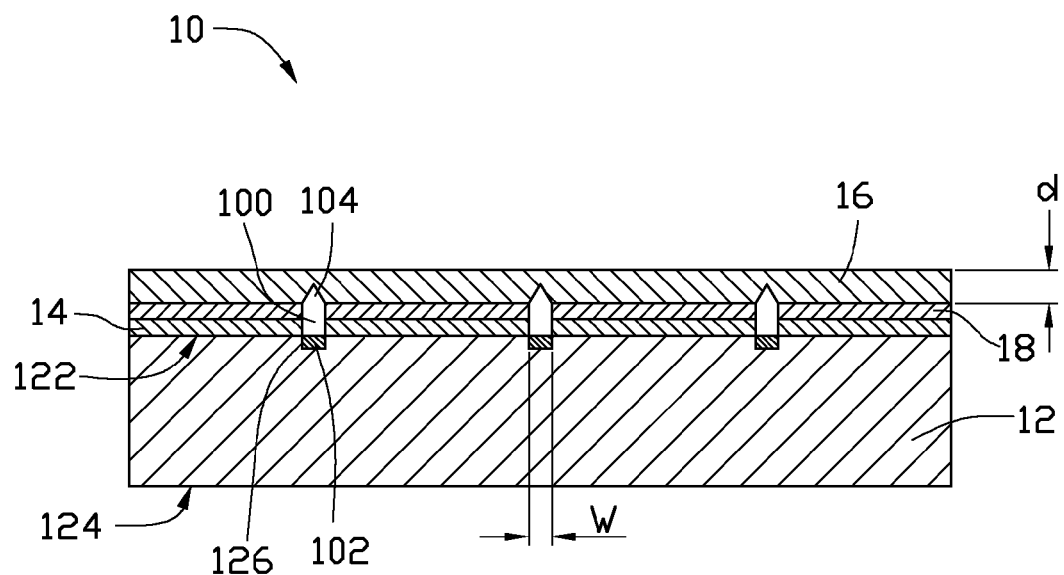
FIG. 1 shows a schematic cross-section of a semiconductor light-emitting structure of a first embodiment of the present disclosure.

Referring to FIG. 1, a first embodiment of a semiconductor light-emitting structure 10 is provided. The semiconductor light-emitting structure 10 includes a silicon substrate 12, a distributed Bragg reflector (DBR) 14, a semiconductor structures layer 16, and an epitaxy connecting layer 18.

The silicon substrate 12 has a top surface 122 and an opposite bottom surface 124. The distributed Bragg reflector 14 is formed on the top surface 122 of the silicon substrate 12. The distributed Bragg reflector 14 is generally made of $Ta_2O_5/SiO_2$, $TiO_2/SiO_2$, $SiO_2/HfO_2$ or other oxides, for reflecting upwardly a portion of light generated by the semiconductor structures layer 16 which moves originally downwards towards the silicon substrate 12, such that the luminescence efficiency of the semiconductor light-emitting structure 10 can be enhanced. The distributed Bragg reflector 14 is structured by multi-layers film. The epitaxy connecting layer 18 is formed between the distributed Bragg reflector 14 and semiconductor structures layer 16, which is a dielectric layer for providing growing environment to the semiconductor structures layer 16.

A method for manufacturing the epitaxy connecting layer 18 generally includes forming a patterned photoresist layer on a continuous aluminum film which is placed on the distributed Bragg reflector 14, etching the aluminum film until to expose the top surface 122 of the silicon substrate 12, removing the photoresist layer by etching or other methods, and oxidizing or nitriding the aluminum film on the distributed Bragg reflector 14. The epitaxy connecting layer 18 is an $Al_2O_3$ or AN film. The epitaxy connecting layer 18 can be formed on the distributed Bragg reflector 14 by other methods, such as TE (Thermal Evaporation), EBE (E-beam Evaporation), IBS (Ion beam Sputter), CVD (Chemical Vapor Deposition), PVD (Physical Vapor Deposition), etc.

In addition, a number of grooves 100 are extended through the distributed Bragg reflector 14 and epitaxy connecting layer 18 to divide the distributed Bragg reflector 14 and epitaxy connecting layer 18 into a plurality of individual parts.

The top surface 122 of the substrate 12 defines a plurality of concaves 126 corresponding to the grooves 100. Each concave 126 aligns with one of the grooves 100. A blocking layer 102 is filled in the concaves 126 of the silicon substrate 12. In present embodiment, the blocking layer 102 is consisted of a plurality of separated pads (not labeled) in the concaves 126 of the substrate 12.

The semiconductor structures layer 16 includes an N-type semiconductor layer, a light-emitting layer and a P-type semiconductor layer (not shown) sequentially grown from a top face of the epitaxy connecting layer 18. The N-type semiconductor layer may be an N-doped GaN, AlGaN, InGaN or AlInGaN layer, the P-type semiconductor layer may be a P-doped GaN, AlGaN, InGaN or AlInGaN layer, and the light-emitting layer may be a muti-quantum well structure. Since the semiconductor structures layer 16 is well known to a person skilled in the art, the details of the different layers thereof are not shown in the drawings. Since the blocking layer 102 prevents the semiconductor structures layer 16 from growing on a top surface thereof, the semiconductor structures layer 16 can only be grown on the top face of the epitaxy connecting layer 18 vertically and upwardly. During vertical growth, the semiconductor structures layer 16 also has a lateral growing trend so that discrete parts of the semiconductor structures layer 16 grown from the top face of the epitaxy connecting layer 18 would join with each other at places over the blocking layer 102. The semiconductor structures layer 16 is thus grown to a continuous layer. Preferably, the width W of the groove 100 and the thickness d of the semiconductor structures layer 16 should conform to the relation of W<2d, the semiconductor structures layer 16 forms a plurality of triangular slots 104 over the blocking layer 102 and communicating with the grooves 100, respectively. Each of the triangular slots 104 has a width gradually decreasing along a direction away from the silicon substrate 12 towards the semiconductor structures layer 16.

The grooves 100 can effectively relieve concentrated thermal stress between the semiconductor structures layer 16 and the silicon substrate 12, thereby protecting the semiconductor structures layer 16 from facture. In addition, the multi-layers distributed Bragg reflector 14 is configured for reflecting the light generated by the semiconductor structures layer 16 and originally toward the silicon substrate 12 to be away from the silicon substrate 12; therefore, the luminescence efficiency of the semiconductor light-emitting structure 10 can be enhanced.

Figure 2:
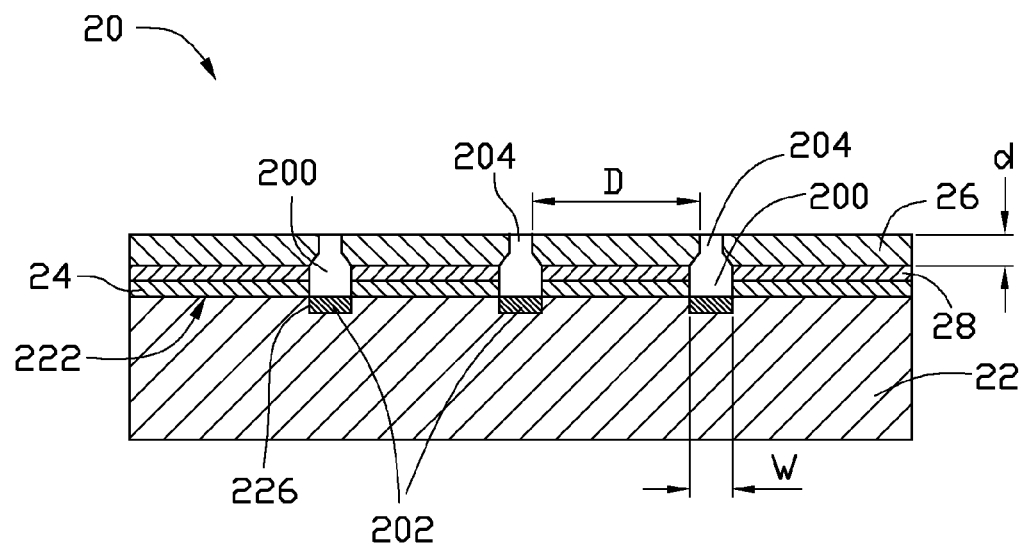
FIG. 2 shows a schematic cross-section of a semiconductor light-emitting structure of a second embodiment of the present disclosure.

Referring to FIG. 2, a second exemplary embodiment of a semiconductor light-emitting structure 20 is provided. The semiconductor light-emitting structure 20 includes a silicon substrate 22, a distributed Bragg reflector 24, a semiconductor structures layer 26, an epitaxy connecting layer 28 and a blocking layer 202. A number of grooves 200 are formed between the semiconductor structures layer 26 and the silicon substrate 22 to divide the distributed Bragg reflector 24 and epitaxy connecting layer 28 into a plurality of individual parts. The top surface 222 of the substrate 22 defines a plurality of concaves 226 corresponding to the grooves 200. Each concave 226 aligns with one of the grooves 200. The blocking layer 202 is filled in the concaves 226 of the silicon substrate 22. The semiconductor light-emitting structure 20 differs from that of the first exemplary embodiment in the distributions and configuration of the grooves 200.

In this embodiment, the width W of the groove 22 and the thickness d of the semiconductor structures layer 26 conform to the relation of W>d, preferably W>3d. The semiconductor structures layer 26 includes a plurality of dispersed portions, and an opening 204 is formed between each two neighboring portions, over the blocking layer 202 and communicating with a corresponding groove 200. A distance D between two adjacent openings 204 of the semiconductor structures layer 26 is equal to a width of a single light-emitting diode chip, for facilitating the cutting process of the semiconductor light-emitting structure 20 into a plurality of light-emitting diode chips and to improve the heat dissipation efficiency and luminescence efficiency of the semiconductor light-emitting structure 20.

Figure 3:
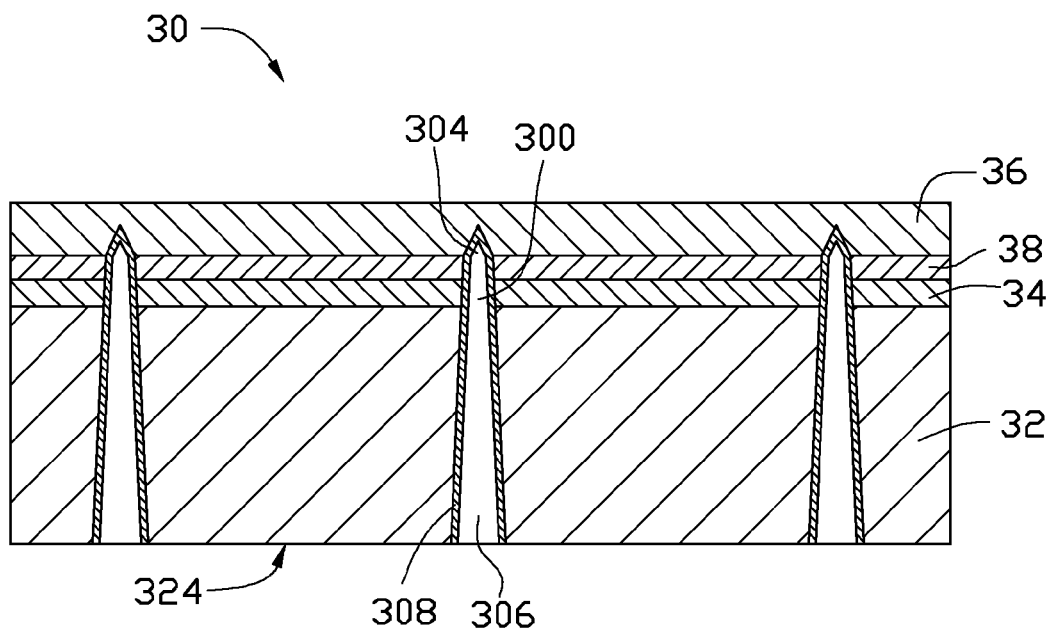
FIG. 3 shows a schematic cross-section of a semiconductor light-emitting structure of a third embodiment of the present disclosure.

Referring to FIG. 3, a third exemplary embodiment of a semiconductor light-emitting structure 30 is provided. The semiconductor light-emitting structure 30 includes a silicon substrate 32, a distributed Bragg reflector 34, a semiconductor structures layer 36, and an epitaxy connecting layer 38. A number of grooves 300 are formed between the semiconductor structures layer 36 and the silicon substrate 32. A plurality of triangular slots 304 communicates with the grooves 300. The triangular slots 304 are the same as the triangular slots 104 of the semiconductor light-emitting structure 10 in the first exemplary embodiment. The semiconductor light-emitting structure 30 differs from that of the first exemplary embodiment in the configuration of the silicon substrate 32.

In this embodiment, the silicon substrate 32 includes a number of channels 306 communicating with the grooves 300, respectively. The channels 306 extend to a bottom surface 324 of the silicon substrate 32 and each contain an electrically conductive material 308 therein. The electrically conductive material 308 extends in the groove 300 and the triangular slot 304. The semiconductor structures layer 36 can be electrically connected to the silicon substrate 32 by the electrically conductive materials 308.

Figure 4:
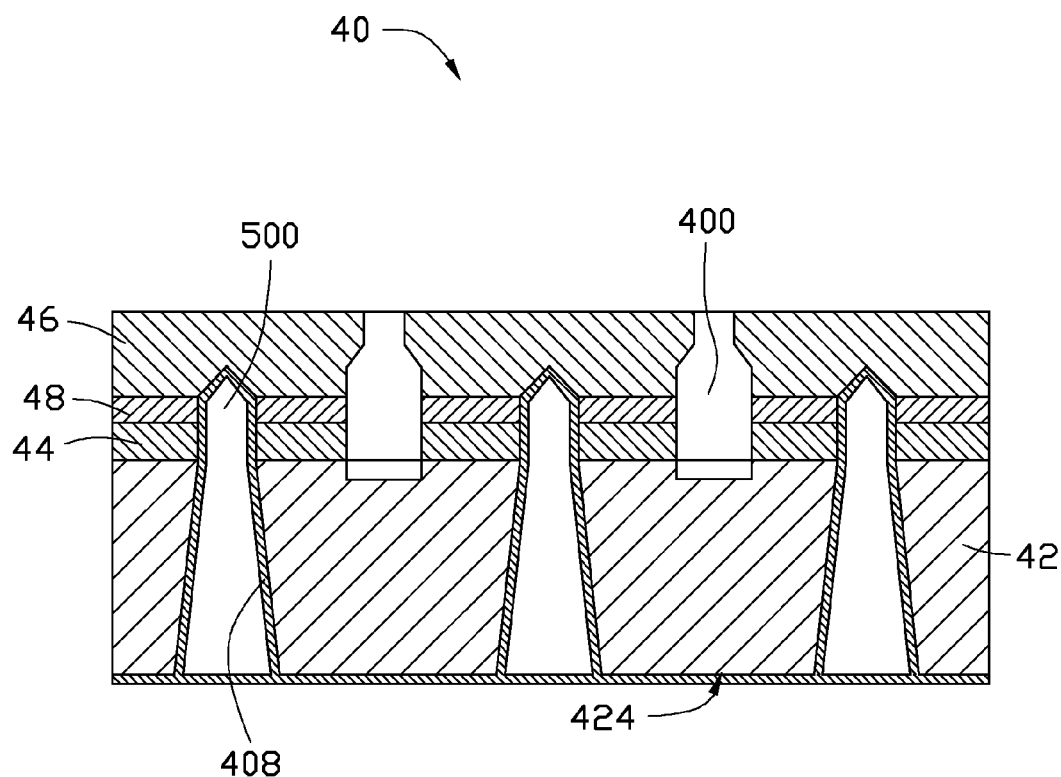
FIG. 4 shows a schematic cross-section of a semiconductor light-emitting structure of a fourth embodiment of the present disclosure.

Referring to FIG. 4, a fourth exemplary embodiment of a semiconductor light-emitting structure 40 is provided. The semiconductor light-emitting structure 40 includes a silicon substrate 42, a distributed Bragg reflector 44, a semiconductor structures layer 46, and an epitaxy connecting layer 48. A number of grooves 400 like the grooves 200 in the second exemplary embodiment and a number of grooves 500 like the grooves 300 in the third exemplary embodiment are alternately formed between the semiconductor structures layer 46 and the silicon substrate 42. Furthermore, an electrically conductive material 408 placed in each groove 500 extends onto the bottom surface 424 of the silicon substrate 42.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A semiconductor light-emitting structure comprising:
    a silicon substrate having a top surface;
    a distributed Bragg reflector formed on the top surface of the silicon substrate;
    a semiconductor structures layer configured for emitting light; and
    an epitaxy connecting layer placed between the distributed Bragg reflector and the semiconductor structures layer, in which a plurality of grooves extend from the semiconductor structures layer through the epitaxy connecting layer and the distributed Bragg reflector to reach the semiconductor structures layer.

2. The semiconductor light-emitting structure as claimed in claim 1, wherein the distributed Bragg reflector is made of $Ta_2O_5/SiO_2$, $TiO_2/SiO_2$, or $SiO_2/HfO_2$.

3. The semiconductor light-emitting structure as claimed in claim 1, wherein the epitaxy connecting layer is an $Al_2O_3$ or AlN film.

4. The semiconductor light-emitting structure as claimed in claim 1, wherein the grooves divide the distributed Bragg reflector and epitaxy connecting layer into a plurality of individual parts.

5. The semiconductor light-emitting structure as claimed in claim 1, wherein the grooves extend into the top surface of the silicon substrate to define a plurality of concaves in the top surface of the silicon substrate, and a blocking layer is filled in the concaves of the silicon substrate.

6. The semiconductor light-emitting structure as claimed in claim 5, wherein each of the grooves has a width less than a double of a thickness of the semiconductor structures layer, the grooves form a plurality of triangular slots in a bottom of the semiconductor structures layer, and the triangular slots are located over the blocking layer.

7. The semiconductor light-emitting structure as claimed in claim 6, wherein each of the triangular slots has a width gradually decreasing along a direction from the silicon substrate towards the semiconductor structures layer.

8. The semiconductor light-emitting structure as claimed in claim 6, wherein each of the triangular slots is terminated within the semiconductor structures layer.

9. The semiconductor light-emitting structure as claimed in claim 5, wherein each of the grooves has a width greater than a thickness of the semiconductor structures layer, and the semiconductor structures layer forms a plurality of openings over the blocking layer and communicating with the grooves, respectively.

10. The semiconductor light-emitting structure as claimed in claim 9, wherein each of the grooves has a width greater than a triple of a thickness of the semiconductor structures layer, and a distance between two adjacent openings of the semiconductor structures layer is equal to a width of one of light-emitting diode chips obtainable by cutting the semiconductor light-emitting structure through the openings.

11. The semiconductor light-emitting structure as claimed in claim 1, wherein the silicon substrate comprises a plurality of channels communicating with the grooves, respectively, the channels extend to a bottom surface of the silicon substrate, an electrically conductive material distributes in each of the grooves and a corresponding channel.

12. The semiconductor light-emitting structure as claimed in claim 11, wherein the electrically conductive material extends to a bottom surface of the silicon substrate.

13. The semiconductor light-emitting structure as claimed in claim 11, further comprising a plurality of additional grooves alternated with the grooves, the additional grooves extending through the semiconductor structures layer, the epitaxy connecting layer and the distributed Bragg reflector.

14. The semiconductor light-emitting structure of claim 13, wherein the electrically conductive material extends to a bottom surface of the silicon substrate.

* * * * *